United States Patent [19]

Ogawa

[11] Patent Number: 5,060,032
[45] Date of Patent: Oct. 22, 1991

[54] INSULATED GATE TRANSISTOR OPERABLE AT A LOW-DRAIN-SOURCE VOLTAGE

[75] Inventor: Kenji Ogawa, Tokyo, Japan
[73] Assignee: NEC Corporation, Japan
[21] Appl. No.: 611,453
[22] Filed: Nov. 13, 1990

Related U.S. Application Data

[63] Continuation of Ser. No. 252,159, Sep. 30, 1988, abandoned.

[30] Foreign Application Priority Data

Sep. 30, 1987 [JP] Japan .................................. 62-248311

[51] Int. Cl.$^5$ ............................................. H01L 29/78
[52] U.S. Cl. ................................. 357/23.4; 357/23.8; 357/51
[58] Field of Search ......................... 357/23.4, 23.8, 51

[56] References Cited

U.S. PATENT DOCUMENTS 4,841,345  6/1989  Majumdar ........................... 357/23.8
4,901,127  2/1990  Chow et al. ......................... 357/23.4

FOREIGN PATENT DOCUMENTS 60-17026  3/1985  Japan .................................. 357/23.4

OTHER PUBLICATIONS

Analysis of the Lateral Insulated Gate Transistor, Simpson, et al., Dec. 1985, IEDM, 740–743, Philips Laboratories.
25 AMP, 500 Volt Insulated Gate Transistors, Chang et al, 1983, Dec. IEDM, 83–86, General Electric Company.

*Primary Examiner*—Jerome Jackson, Jr.
*Attorney, Agent, or Firm*—Laff, Whitesel, Conte & Saret

[57] ABSTRACT

A transistor having a semiconductor substrate of a first conductivity type, a base region of a second conductivity type formed in the semiconductor substrate, a source region of the first conductivity type, a gate electrode formed on the base region between the source region and the semiconductor substrate via a gate insulator film, an additional region of the second conductivity type formed in the semiconductor substrate but separated from the base region, a resistive layer formed in electrical contact with an area of the semiconductor substrate which is separated from the base region and the additional region, a source electrode connected with the source region and a drain electrode connected with the additional region and the resistive layer.

4 Claims, 5 Drawing Sheets

INSULATED GATE TRANSISTOR OPERABLE AT A LOW-DRAIN-SOURCE VOLTAGE

This application is a continuation of application Ser. No. 07/252,159, filed Sept. 30, 1988, now abandoned.

BACKGROUND OF THE INVENTION

1. Field of the Invention

This invention relates to an insulated gate transistor (IGT) having a PN-junction region in a drain region of a MOS field effect transistor using a semiconductor substrate as the drain region and, more particularly, to an improvement which is operable at a low drain-source voltage (VDS).

2. Description of the Related Art

As a high-power device, a vertical MOS field effect transistor has been widely used wherein a source region of one conductivity type is formed in a base region of the other conductivity type, which in turn is formed in a semiconductor substrate of the one conductivity type, as a drain region. A gate electrode is formed on the base region located between the source and drain regions, via a gate insulator film. This kind of vertical MOS field effect transistor enables a drain current to flow across the thickness of the semiconductor substrate, thus allowing a large power consumption. This vertical MOS field effect transistor, however, has a drawback since it has a large ON-resistance due to the current flow across the thickness of the substrate which causes a large power loss.

For solving the problem of this large ON-resistance, an IGT has been proposed by M. F. Chang et al in IEDM83, pages 83 to 86. The IGT has a high impurity region of the other conductivity type in the drain region which is in contact with the drain electrode to interpose the other conductivity type region between the drain region and the drain electrode. According to this IGT, a charge carrier injection of other conductivity type carriers is generated from the high impurity region to the drain region as a reaction to the drain current flowing into the high impurity region. By the carrier injection, a conductivity modulation is generated to make the ON-resistance very small.

The injected charge carriers are, however, majority carriers of the high impurity region. Therefore, the PN-junction between the drain region and the high impurity region is necessarily forwardly biased. This required forward bias restricts the lower limit of the drain-source voltage to more than 0 5 or 0.6 volts. In a region of the drain-source voltage which is lower than this value, there is only a little drain current, thus losing the transistor action. Thus, the proposed IGT has a drawback that it does not operate in a low drain-source voltage.

The proposed IGT has another drawback since there is a deterioration of the operating speed. When the IGT turns off, a discharging path does not exist for the charges in the drain region due to the existance of the high impurity region. Therefore, the IGT does not turn off until the charges in the drain region disappear by recombination in the drain region.

As an IGT which is operable at a low drain-source voltage and with a high speed, a lateral IGT has been proposed, by M. R. Simpson in IEDM85, pages 740 to 743. In this lateral IGT, the high impurity region is formed in the same surface of the drain region in which the base and source regions are formed. The drain electrode is connected with the high impurity, region and a portion of the drain region located on the opposite side of the high impurity region to the source and drain regions. Drain current flows laterally along the surface of the drain region.

In a high drain-source voltage region, the PN-junction between the high impurity region and the drain region is forwardly biased to allow the carrier injection. The resistance component of the drain region under the high impurity region restricts the drain current following directly to the drain electrode, thus resulting in the IGT operation. On the other hand, in a low drain-source voltage region, since the IGT operation does not function due to an insufficient forward bias of the PN-junction between the high impurity region and the drain region, the drain current bypasses the high impurity region to flow directly to the drain electrode resulting in a MOS field effect transistor action. Thus, the lateral IGT can operate in a low drain-source voltage region. Furthermore, if the lateral IGT turns off, the carriers remaining in the drain region can be discharged through the direct connection of the drain region and the drain electrode. Therefore, the lateral IGT can operate at a high speed.

This lateral IGT, however, has a large ON-resistance based on a drain current flowing along the surface of the drain region. For the same reason, this IGT requires a large area on a semiconductor chip to increase the current capacity.

Another improvement of the IGT has been proposed by T. Goto et al in a Japanese Laid-open Patent Application No. 60-170263 published on Sept. 3, 1985. This improved IGT has the high impurity region of a lattice shape or a comb shape in a bottom region of the drain region. This improvement gives an improved high speed operation, a low ON-resistance and a large current capacity. It is, however, difficult to obtain a sufficient resistance component in the drain region positioned adjacent to the high impurity region. Due to this insufficient resistance component, the MOS field effect transistor normally operates up to a large drain-field source voltage. The low ON-resistance cannot be obtained until the drain-source becomes fairly high voltage.

SUMMARY OF THE INVENTION

It is, therefore, a primary object of the present invention to provide an IGT which is operable at a low drain-source voltage and at a high speed.

It is another object of the present invention is to provide an IGT having a large current capacity and showing a low ON-resistance even at a low drain-source voltage.

The present invention provides a transistor having a semiconductor substrate of one conductivity type having an upper surface portion and a bottom surface portion. A base region of the other conductivity type is formed in the upper surface portion of the semiconductor substrate. A source region of the one conductivity type is formed in the base region. A source electrode is connected to the source region. A gate insulator film covers the base region and is positioned between the region and the semiconductor substrate. A gate electrode is formed on the gate insulator film. An additional region of the other conductivity type is formed in the semiconductor substrate apart from the base region. A resistance region is formed in electrical contact with the bottom surface portion. A drain electrode is formed in contact with the additional region and the resistance region. The resistance region may be formed by resistive material deposited o the bottom surface portion or by a resistance region formed in a semiconductor region formed outside, but combined with, the semiconductor substrate and connected to the additional region.

According to the present invention, the additional region is formed in the semiconductor substrate apart from the base region. The drain electrode is connected to the bottom surface portion via the resistance region and the additional region. Therefore, although the transistor operates as an IGT when the drain-source voltage is large, it operates as a vertical MOS field effect transistor when the drain-source voltage is small. Furthermore, the charges in the semiconductor substrate which operates as a drain region can be discharged to the drain electrode through the bottom surface portion and the resistance region. Thus the transistor according to the present invention can operate at a high speed. The drain current flows vertically across the thickness of the semiconductor substrate. Therefore, the transistor has a small ON-resistance and may have a large current capacity. Although the resistive component of the bottom surface portion at the remaining part is not enough for making the transistor operate at the IGT with a small drain-source voltage, this drawback is improved by using the resistance region. Thus, the transistor of the present invention operates to show a small ON-resistance for a small drain-source voltage.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
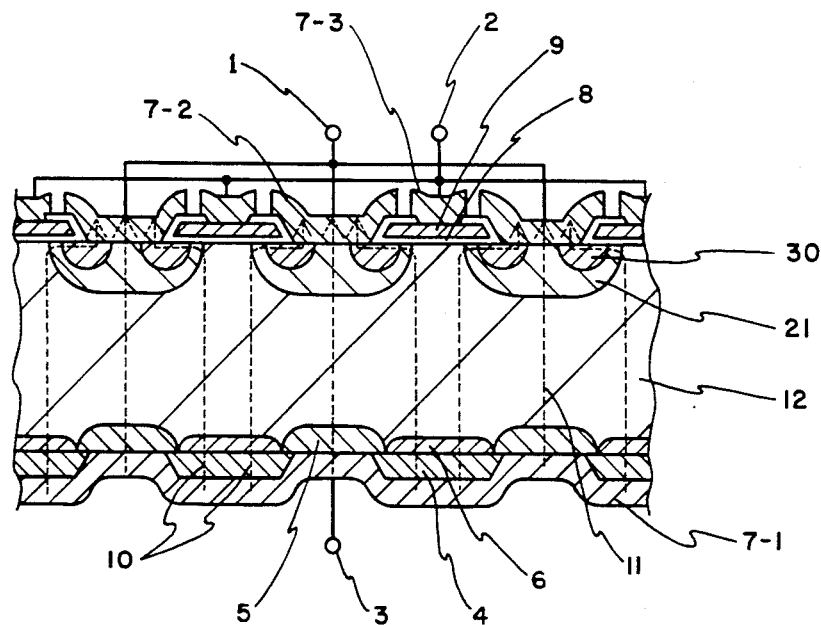
FIG. 1 is a sectional view showing a first preferred embodiment of the present invention.

Referring to FIG. 1, the first preferred embodiment uses an N-type Si substrate 12 having an impurity concentration of $2.5 \times 10^{14}$ cm$^{-3}$ and a thickness of 100 $\mu$m. A plurality of stripes of P-type base regions 21 having an impurity concentration of $9 \times 10^{16}$ cm$^{-3}$ and having a depth of 6 $\mu$m are formed in an upper surface portion of the substrate 12. In each stripe of base region 21, two stripes of N+-type source regions 30 are formed with and separated from each other. Each stripe of the source region 30 has an impurity concentration of $2.5 \times 10^{18}$ cm$^{-3}$ and a depth of 3 $\mu$m. A gate insulator film 8 of SiO$_2$ having a thickness of 1,000 Å are thermally grown up on the whole upper surface of the substrate 12. Then, the gate film 8 is etched away from the base regions 21 interposed between the two stripes of source regions 30 which are formed in the same base region 21 and from parts of the source regions 30 adjacent to the exposed region of the base region 21. On the remaining gate insulator film 8, gate electrodes 9 are formed with polycrystalline silicon to have a thickness of 5,000 Å. The gate electrodes 9 are covered with an SiO$_2$ film having a stripe of aperture. The exposed base and source regions are covered with a comb-shape source electrode 7-2 of aluminum and are connected to a source terminal 1. The exposed portions of the gate electrodes 9 are also covered with a comb-shape gate wiring 7-3 of aluminum and are connected to a gate terminal 2.

The bottom surface portion of the substrate 12 has a plurality of stripes of N+-type regions 6 having an impurity concentration of $4 \times 10^{17}$ cm$^{-3}$ and a depth of 2 $\mu$m and a plurality of stripes of P+-type regions 5 having an impurity concentration of $3.5 \times 10^{18}$ cm$^{-3}$ and a depth of 3 $\mu$m. The stripes of the N+-type regions 6 and the stripes of the P+-type regions 5 are alternately formed. On the N+-type regions 6, resistance regions 4 of an Ni-Cr layer having a thickness of 5,000 Å. These resistance regions 4 may be formed with epitaxially grown impurity-doped Si. The resistance across the thickness of the resistance regions is selected to have a resistance in a range from 1/10 to 10 times of ON-resistance of the obtained transistor, at a MOS field effect transistor operation. The typical value of the resistance of the resistance region is from 10 to 50 ohms. A drain electrode 7-1 of aluminum is formed to cover all the P+-type regions 5 and the resistance regions 4. The drain electrode 7-1 is connected to a drain terminal 3.

According to the transistor of the first preferred embodiment, if the drain-source voltage $V_{DS}$ is small, the PN-junctions between the N-type substrate 12 and the P+-type regions 5 are not forwardly biased, thus producing no current 11 flow through the PN-junction but making current 10 flow through the N+-type region 6 and the resistance regions 4. Thus, the transistor operates as a MOS field effect transistor in an operational condition of a small drain-source voltage $V_{DS}$. As the drain-source voltage $V_{DS}$ increases, the drain current becomes large, and the voltage drop across the N+-type region 6 and the resistance region 4 increases. When the voltage drop becomes larger than a forward-biasing voltage of the PN-junction, that is, larger than 0.6 volts, electrons in the substrate 12 are allowed to flow into the P+-type regions 5 and to inject holes from the P+-type regions 5 into the substrate 12. This hole-injection produces a conductivity-modulation in the substrate 12 to operate the transistor as the IGT. By the IGT-operation, the ON-resistance of the current flow 11 becomes very small. The majority of current flows through the P−-type regions 5 with a small ON-resistance. Thus, the transistor operates in a wide range of drain-source voltage with a small ON-resistance. The ON-resistance of the MOS field effect transistor operation is small as compared to the ON-resistance of the lateral IGT in the prior art.

Furthermore, the first preferred embodiment uses additional resistance regions 4, a sufficient resistance can be applied in parallel with the P−-type region 5 in vertical direction. The applied resistance is easily controlled. Therefore, in spite of the vertical action, the IGT operation can be maintain to a sufficiently low drain-source voltage.

Figure 2:
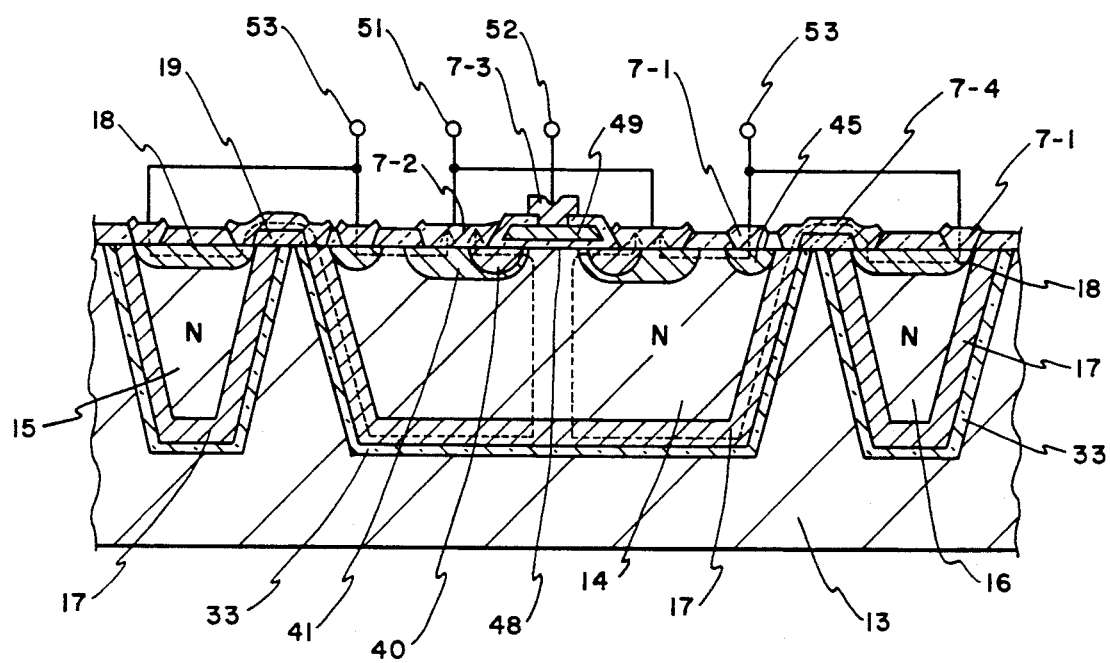
FIG. 2 is a sectional view showing a second preferred embodiment of the present invention.
Figure 3:
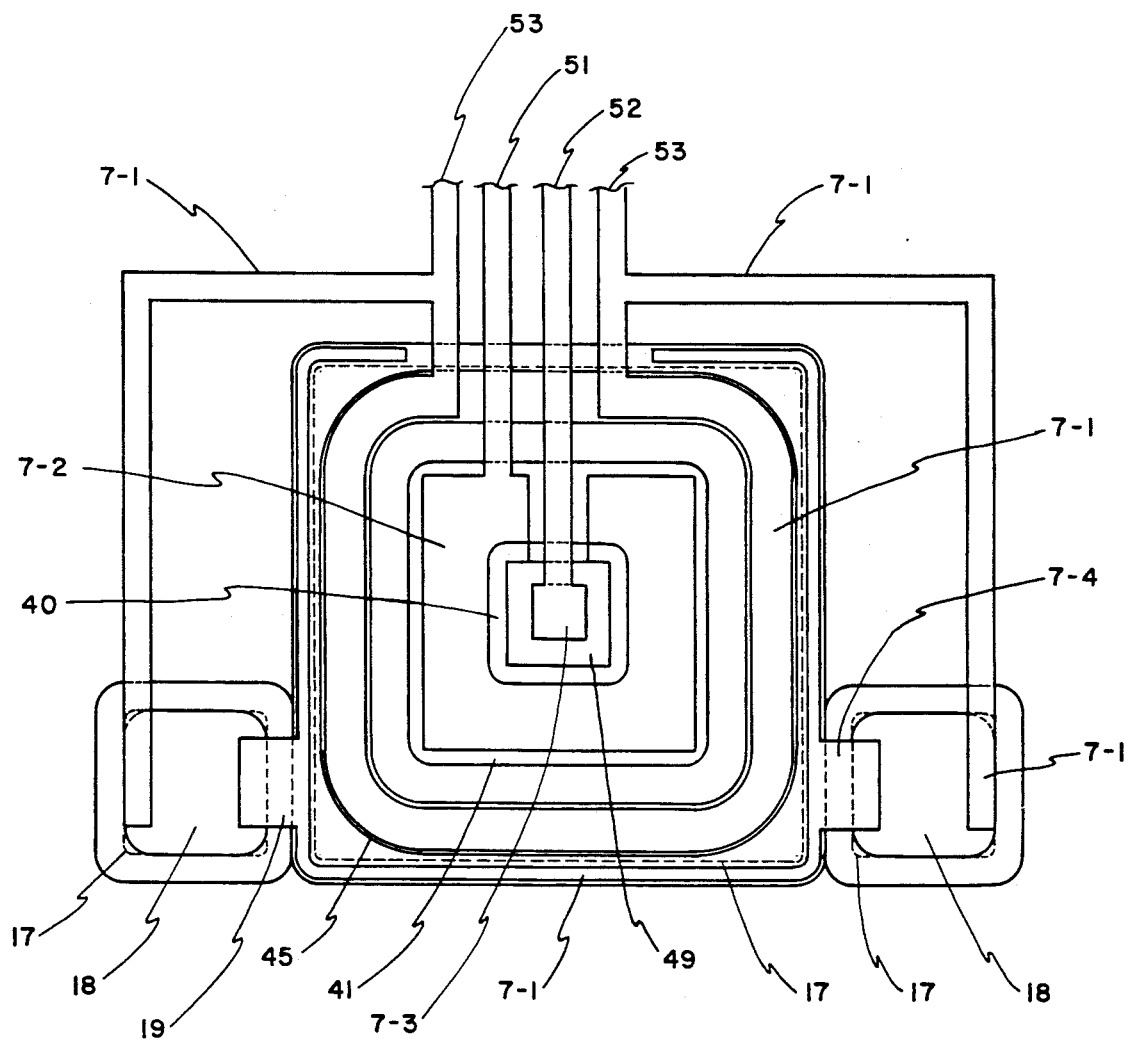
FIG. 3 is a plane view showing the second preferred embodiment of the present invention.

Referring now to FIGS. 2 and 3, the second preferred embodiment according to the present invention will be described. The transistor is formed in Si islands 14, 15 and 16 which are supported by polycrystalline silicon 13 via silicon oxide layers 33. Each Si island is formed of an N-type monocrystalline silicon having an impurity concentration of $2.5 \times 10^{14}$ cm$^{-3}$ and a thickness of 45 µm and has an N$^+$-type layer 17 having an impurity concentration of $4 \times 10^{17}$ cm$^{-3}$ and a thickness of 8 µm on side and bottom surfaces. A P-type ring-shape base region 41 having an impurity concentration of $9 \times 10^{16}$ cm$^{-3}$ and a depth of 6 µm is formed in the Si island 14. An N$^+$-type ring-shape source region 40 having an impurity concentration of $2.5 \times 10^{18}$ cm$^{-3}$ and a depth of 3 µm is formed in the base region 41. A gate insulator film 48 of SiO$_2$ having a thickness of 1,000 Å is formed to cover the portion surrounded by the ring-shape source region 40 with some coverage over the source region 40. A gate electrode 49 of polycrystalline silicon having a thickness of 5,000 Å is formed on the gate insulator film 48 and is covered with a SiO$_2$ layer having an aperture to expose a part of the gate electrode 49. A gate wiring 7-3 of aluminum is connected to the exposed part of the gate electrode 49 to connect with a gate terminal 52. Aluminum source electrode 7-2 contacts both the source and the base regions 40 and 41 to make a connection with a source terminal 51. A ring-shape P$^+$-type region 45 having an impurity concentration of $3.5 \times 10^{18}$ cm$^{-3}$ and a depth of 4 µm is formed in the island 14 so as to surround, but be isolated from, the base region 41.

The P-type resistance regions 18 having an impurity concentration of $1.5 \times 10^{18}$ cm$^{-3}$ are respectively formed by impurity diffusion in the islands 15 and 16. One end of each resistance region 18 is connected to the N$^+$-type region 17 in the island 14 by an aluminum wiring 7-4 which is isolated from the N$^+$-type regions 17 in the islands 15 and 16 by silicon oxide layer 19. The other end of each resistance region 18 is connected to the P$^+$-type region 45 with aluminum drain electrode 7-1 which is connected to drain terminal 53. It is noted that, although two drain terminals 53 are shown, those two drain terminals 53 are used in an application by electrically connecting with each other.

When the drain-source voltage V$_{DS}$ is small, the PN-junction between the P$^+$-type region 45 and the N-type island 14 is not biased forwardly. Drain current flows through a route of the drain electrode 7-1+, the resistance region 18+, the aluminum wiring 7-4+,the N$^+$-type region 17 in the island 14+, the island 14-the base region 41 under the gate electrode 49+, the source region 40+, the source electrode 7-2. Therefore, the transistor operates as a MOS field effect transistor.

As the drain-source voltage V$_{DS}$ increases, the drain current rises to increase the voltage drop across the resistance region 18. When the voltage drop rises to forward bias the PN-junction between the P$^+$-type region 45 and the N-type island 14, electrons are supplied from the source region 40 to the island 14 via the base region 41 under the gate electrode 49. These electrons flow into the P$^+$-type region 45. In response thereto, holes are injected into the island 14 from the P$^+$-type region 45 and then drawn to the drain region 41 in order to produce a current flowing through the P$^{30}$ $^+$type region 45+, the island 14+, the base region 41+, the source electrode 7-2. Therefore, the transistor operates as an IGT.

Figures 4, 5:
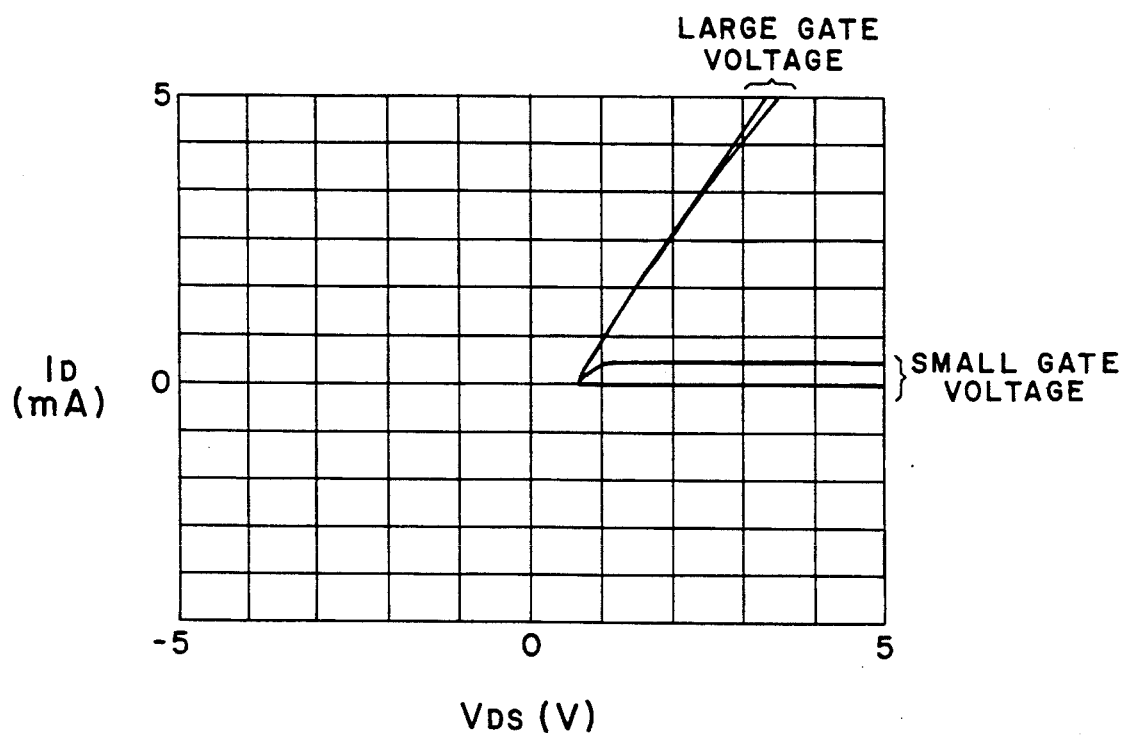
FIG. 4 is a graph showing a relationship between drain current and drain-source voltage of the IGT in the prior art.
FIGS. 5, 6 and 7 are graphs showing a relationship between drain current and drain-source voltage of the transistors according to the second preferred embodiment having various resistances of the used resistance regions.
Figure 6:
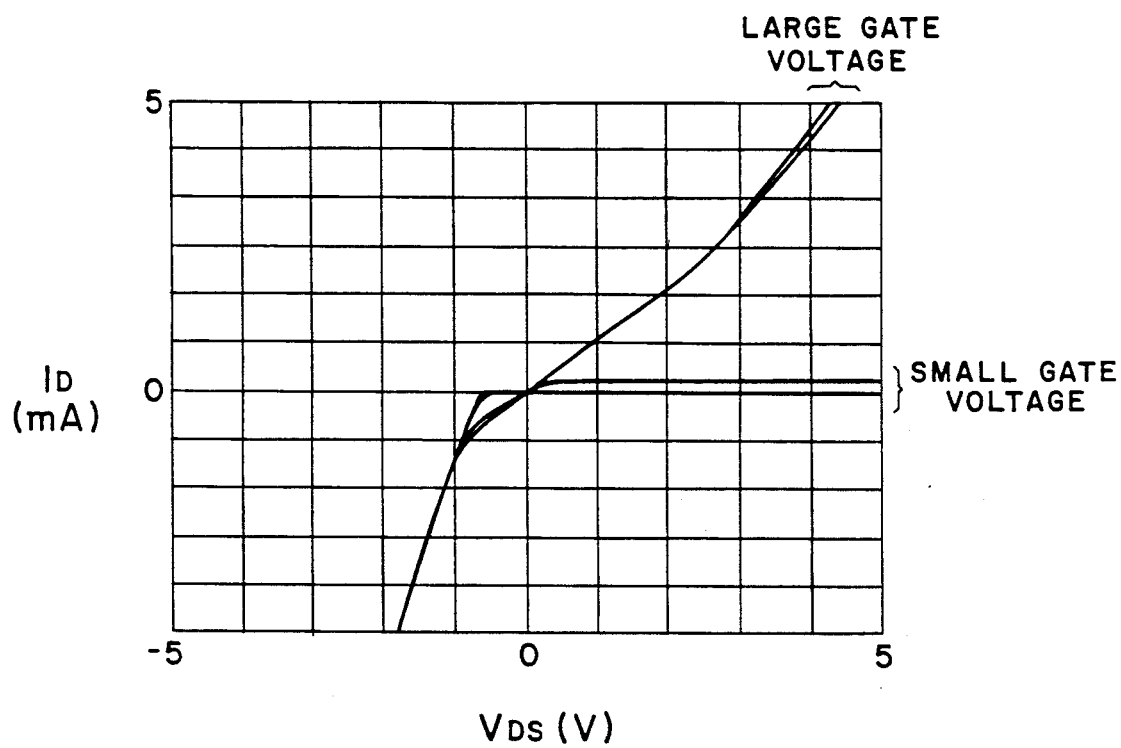
Figure 7:
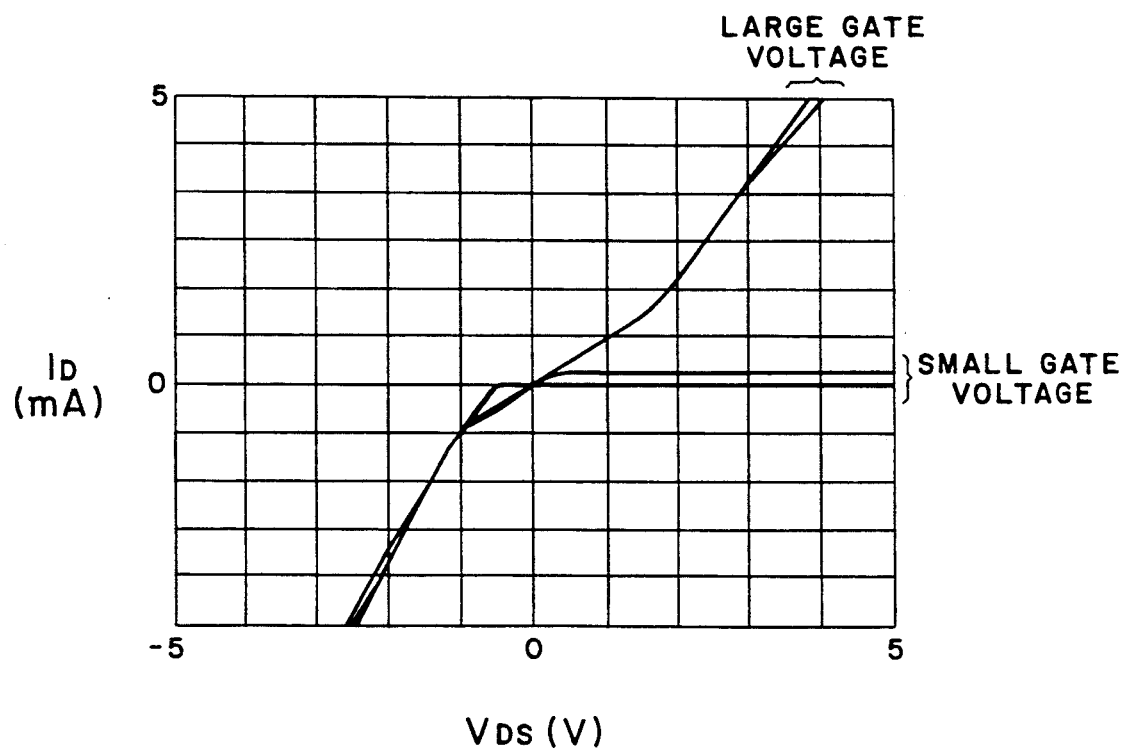

The effect of the resistance in the resistance region 18 will be explained. FIG. 4 shows a relationship between the drain current I$_D$ and the drain-source voltage V$_{DS}$ of the prior art IGT in which a one conductivity-type Si substrate has another conductivity-type region on all over the bottom surface as disclosed in IEDM83, pages 83 to 86. The drain current I$_D$ stops flowing in the drain-source voltage range below 0.7 volts. In contrast, the drain current I$_D$ of the transistor shown in FIGS. 2 and 3 flows at the drain-source voltage range below 0.7 volts, as shown in FIGS. 5, 6 and 7.

FIG. 5 is a case of the transistor having the resistance region 18 of 15 ohms and shows a turning point between MOS and IGT operations at the drain-source voltage V$_{DS}$ of about 2.8 volts. FIG. 6 is a case having the resistance region 18 of 20 ohms and shows the turning point at about 2.4 volts. FIG. 7 is a case having the resistance region 18 of 39 ohms and shows the turning point at about 1.5 volts. As is apparent from FIGS. 5, 6 and 7, the turning point between the MOS and IGT operations lowers with increment of the resistance of the resistance region 18. This means the turning point may be arbitrarily controlled by adjusting the resistance of the resistance region 18. The resistance of the resistance region 18, however, should be selected in a range from 1/10 to 10 times of ON-resistance of the transistor operating as the MOS field effect transistor.

Figure 8A:
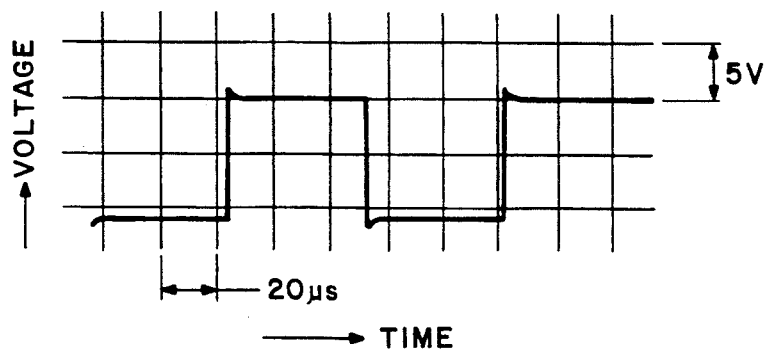
FIGS. 8(a) and 8(b) are graphs showing input and output waveforms of the IGT in the prior art.
Figure 8B:
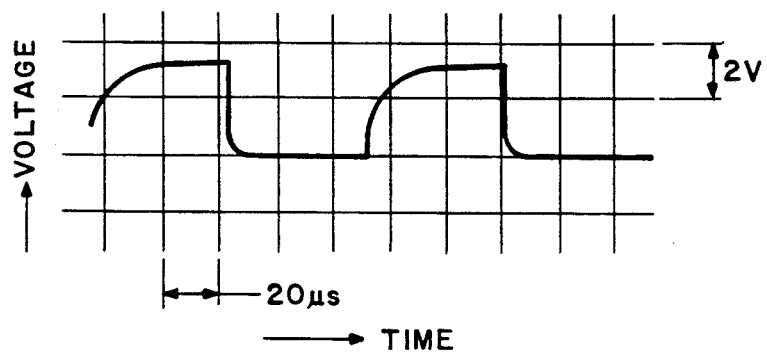
Figure 9A:
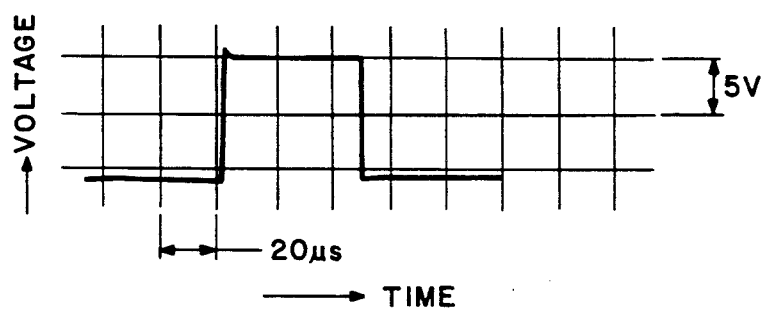
FIGS. 9(a) and 9(b) are graphs showing input and output waveforms of the transistor according to the second preferred embodiment of the present invention.
Figure 9B:
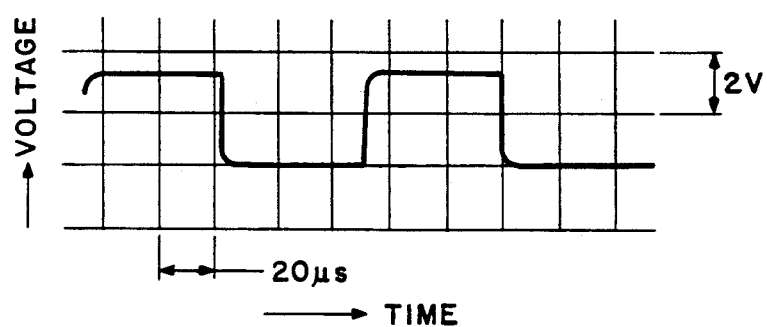

FIGS. 8(a) and 8(b) are input and output waveforms of the prior art IGT as disclosed in IEDM 83 pages 83 to 86. The output waveform is deformed at its leading edges corresponding to the off-condition of the IGT just after changed from on-condition. This is because, when the IGT turns off, charges in the island 14 lose their discharging path and disappear by recombination in the island 14. On the contrast, the transistor according to the second preferred embodiment shows input and output waveforms shown in FIGS. 9(a) and 9(b). The output waveform has sharp leading edges. This result shows a high speed operation. More specifically, the drain electrode 7-1 is connected to the N$^+$-type region 17 in the island 14 through the resistance region 18. Therefore, if the transistor turns off, the charges in the island 14 can quickly discharge through the N$^+$-type region 17 in the island 14 and the resistance region 18, resulting in a quick risinging of the output signal.

Although some preferred embodiments are explained hereinbefore, the present invention is not apparently limited to the above-explained embodiments. Many modifications can be applied. The second preferred embodiment can be formed in a single monocrystalline silicon chip with using islands isolated from each other by means of PN-junction isolation. The resistance regions 18 in the second preferred embodiment may be formed with resistive metal deposited on the field oxide layer.

What is claimed is:

1. A transistor comprising:
   a first semiconductor region of one conductivity type having an upper surface;
   a second semiconductor region of said one conductivity type, said first and second semiconductor regions being physically supported by polycrystalline semiconductor and being electrically isolated from each other;

a base semiconductor region of other conductivity type formed in said upper surface of said first region;

a source semiconductor region of said one conductivity type formed in said base semiconductor region;

a gate insulator film formed on said base semiconductor region located between said source and first semiconductor regions;

a gate electrode formed on said gate insulator film;

a third semiconductor region of said other conductivity type formed in said upper surface of said first region but separated from said base semiconductor region;

a fourth semiconductor region of said one conductivity type formed in said first semiconductor region along its surfaces except for said upper surface, said fourth semiconductor region having an impurity concentration which is higher than said first semiconductor region;

a fifth semiconductor region of said other conductivity type formed in said second semiconductor region, said fifth semiconductor region having first and second contact portions to present a predetermined value of resistance therebetween;

a wiring connecting said fourth semiconductor region and said first contact portion of said fifth semiconductor region; and a drain electrode connected with said fourth semiconductor region and said second contact portion of said fifth semiconductor region.

2. A transistor comprising:

a semiconductor substrate of one conductivity type having an upper surface portion and a bottom surface portion and having a first resistivity;

a base region of the other conductivity type formed in said upper surface portion of said semiconductor substrate;

a source region of said one conductivity type formed in said base region so as to substantially surround a part of said base region;

a gate insulator film formed on a peripheral part of said base region surrounding said source region;

a gate electrode formed on said gate insulator film;

a source electrode connected with said source region and said part of said base region;

a first additional region of said other conductivity type formed in a limited area of said bottom surface of said semiconductor substrate;

a second additional region of said one conductivity type having a second resistivity which is smaller than said first resistivity and formed on a remaining area of said bottom surface portion of said semiconductor substrate;

a resistive material formed on said second additional region at said bottom surface portion of said semiconductor substrate; and a drain electrode connected to said first additional region and said resistive material layer, said resistive material layer presenting a predetermined value of resistance between said remaining area of said bottom surface portion and said drain electrode and said predetermined value of resistance being in a range from 10 to 50 ohms.

3. A transistor operating with an ON-resistance in a turn-on condition, said transistor comprising;

a first region of a first conductivity type semiconductor having an upper surface portion, a bottom surface portion and a side surface portion and having a first resistivity;

a second region of a second conductivity type semiconductor formed in said upper surface portion;

a third region of said first conductivity type semiconductor formed in said second region;

a gate insulator film formed on said second region located between said third and first regions;

a source electrode formed to be connected with said third region;

a fourth region of said second conductivity type semiconductor formed in a first limited area of said first region apart from said second region, said first limited area being located in said upper surface portion of said first region;

a fifth region of said first conductivity type semiconductor formed in a second limited area of said first region apart from said second region and said first limited area and said fifth region having a second resistivity smaller than said first resistivity;

a sixth region of said first conductivity type semiconductor formed adjacent t but electrically isolated from said first region;

a resistive impurity region formed in said sixth region with said second conductivity type semiconductor, said second limited area being said bottom surface portion and said side surface portion of said first region, one part of said resistive impurity region being electrically connected with said side surface portion at said upper surface portion; and a drain electrode contacting said fourth region and another one part of said resistive impurity region, said resistive impurity region presenting a predetermined value of resistance between said second limited area and said drain electrode and said predetermined value of resistance being in a range which is from a tenth to ten time of said ON-resistance.

4. The transistor as claimed in claim 3, wherein said first and sixth regions are physically connected to each other by means of a polycrystalline semiconductor.

* * * * *